(12) United States Patent
Hwang et al.

(10) Patent No.: US 7,816,437 B2
(45) Date of Patent: Oct. 19, 2010

(54) POLYMIDE RESIN COMPOSITION MODIFIED WITH BISMALEIMIDE AND CYANATE

(75) Inventors: Kuen Yuan Hwang, Hsinchu (TW); An Pang Tu, Hsinchu (TW); Sheng Yen Wu, Hsinchu (TW)

(73) Assignee: Chang Chun Plastics Co., Ltd., Taipei (TW)

( * ) Notice: Subject to any disclaimer, the term of this patent is extended or adjusted under 35 U.S.C. 154(b) by 648 days.

(21) Appl. No.: 11/798,154

(22) Filed: May 10, 2007

(65) Prior Publication Data

US 2008/0176984 A1 Jul. 24, 2008

(30) Foreign Application Priority Data

Jan. 22, 2007 (TW) .............................. 96102257 A

(51) Int. Cl.
*C08K 3/08* (2006.01)
*C08K 3/22* (2006.01)
*C08K 3/36* (2006.01)
*C08K 3/38* (2006.01)
*C08K 3/40* (2006.01)
*G08G 18/77* (2006.01)

(52) U.S. Cl. .................. 524/404; 524/425; 524/430; 524/431; 524/433; 524/437; 524/588; 524/589

(58) Field of Classification Search .................. 524/404, 524/425, 430, 431, 433, 437, 588, 589
See application file for complete search history.

(56) References Cited

U.S. PATENT DOCUMENTS

| | | | | |
|---|---|---|---|---|
| 6,767,930 | B1 * | 7/2004 | Svejda et al. | 521/134 |
| 2005/0161210 | A1 * | 7/2005 | Zhong et al. | 165/185 |
| 2005/0277351 | A1 * | 12/2005 | Smith et al. | 442/110 |

* cited by examiner

*Primary Examiner*—Kriellion A Sanders
(74) *Attorney, Agent, or Firm*—Birch, Stewart, Kolasch & Birch, LLP

(57) ABSTRACT

A polyimide resin composition modified with bismaleimide and cyanate, which comprises (a) polyimide resin, (b) cyanate, (c) bismalemide, and (d) nanometer filler. By using the present polyimide resin composition modified with bismalemide and cyanate, heat expansion coefficient of polyimide can be reduced. Also, heat resistance and dimension stability of the polyimide resin can be improved, and thus it is suitable for cladding with copper foil to produce printed circuit board.

6 Claims, No Drawings

POLYIMIDE RESIN COMPOSITION MODIFIED WITH BISMALEIMIDE AND CYANATE

FIELD OF THE INVENTION

The present invention relates to a polyimide resin composition modified with bismaleimide and cyanate.

BACKGROUND OF THE INVENTION

Polyimide film has been widely used in various technical fields because it exhibits excellent high-temperature resistance, excellent chemical-resistance properties, high insulation, and high mechanical strength. For example, polyimide film is advantageously used in the form of a composite sheet of successive aromatic polyimide film/metal film to produce a flexible printed circuit (FPC), a carrier tape of tape automated bonding (TAB), and a lead-on-chip (LOC) structural tape. Especially, the flexible printed circuit board has been broadly applied to materials of laptops, consumer electronic products, and mobile communication equipments.

In the production of printed circuit board, it mainly uses high temperature resistance adhesive agent to apply on a polyimide insulation film, and then laminate with a metal foil such as copper foil, to produce flexible printed circuit board, which is in turn applied to materials of laptops, consumer electronic products, and mobile communication equipments.

The adhesive agent currently used is thermoplastic polyimide system, which has a high heat expansion coefficient, poor heat resistance and poor dimension stability. Moreover, the lamination between the polyimide insulation film and the metal foil should be carried out at an elevated temperature.

In view of the above drawbacks resulted from the use of thermoplastic adhesive agent in production of flexible printed board, there needs an adhesive agent for laminating polyimide film and a metal foil while capable of overcoming the high heat expansion coefficient of thermoplastic polyimide and improving heat resistance and dimension stability without carrying out at an elevated temperature.

The present inventors have conducted an investigation on the structure of polyimide resin and developed a polyimide resin composition modified with bismaleimide and cyanate, which is capable of overcoming the above problems, and thus completed the present invention.

BRIEF DESCRIPTION OF THE INVENTION

The present invention relates to a polyimide resin composition modified with bismaleimide and cyanate, which comprises (a) polyimide resin, (b) cyanate, (c) bismaleimide, and (d) nanometer filler.

By using the present polyimide resin composition modified with bismaleimide and cyanate, a heat expansion coefficient of polyimide can be reduced. Also, a heat resistance and a dimension stability of the polyimide resin can be improved and thus it is suitable for cladding with copper foil to produce printed circuit board.

Accordingly, the present invention provides a polyimide resin composition modified with bismaleimide and cyanate, which comprises (a) polyimide resin, (b) cyanate, (c) bismaleimide, and (d) nanometer filler, wherein (a) polyimide resin is contained in an amount of from 75 to 80% by weight, (b) cyanate is contained in an amount of 0.1 to 10% by weight, (c) bismaleimide is contained in an amount of 0.1 to 10% by weight, and (d) nanometer filler is contained in an amount of 1 to 40% by weight, all based on the total weight of the composition.

According to the polyimide resin composition modified with bismaleimide and cyanate of the present invention, since the cyanate (b) and bismaleimide (c) would be cross-linked by themselves or by each other when heating, the heat expansion coefficient of polyimide can be reduced and its heat stability will be increased, and thus the lamination of polyimide film and metal foil can be carried out at a temperature lower than that conventional used.

DETAILED DESCRIPTION OF THE INVENTION

An object of the present invention is to provide a polyimide resin composition modified with bismaleimide and cyanate, which comprises (a) polyimide resin, (b) cyanate, (c) bismaleimide, and (d) nanometer filler, wherein (a) polyimide resin is contained in an amount of from 75 to 80% by weight, (b) cyanate is contained in an amount of 0.1 to 10% by weight, (c) bismaleimide is contained in an amount of 0.1 to 10% by weight, and (d) nanometer filler is contained in an amount of 1 to 40% by weight, all based on the total weight of the composition.

In the polyimide resin composition modified with bismaleimide and cyanate of the present invention, the polyimide resin (a) is obtained from reacting a diamine represented by the formula (I):

$$H_2N-R^1-NH_2 \quad (I)$$

[wherein $R^1$ represents (i) a direct bond; (ii) $C_{2-12}$ aliphatic divalent group; (iii) $C_{4-30}$ alicyclic divalent group; (iv) $C_{6-30}$ aromatic divalent group; (v) a group of the formula -Ph-O—$R^2$—O-Ph- (wherein $R^2$ represents a phenylene group (-Ph-) or a group of the formula -Ph-X-Ph- in which X represents a direct bond, a C1-4 alkylene group which may be substituted with halogen, a group of —O-Ph-O—, —O—, —CO—, —S—, —SO—, or —$SO_2$—); or (v) a group of the formula —$R^3$—$(SiR^4{}_2-O)_m$—$SiR^4{}_2$—$R^3$— (wherein $R^3$ represents —$(CH_2)_s$—, —$(CH_2)_s$-Ph-, —$(CH_2)_n$—O-Ph- or -Ph-, in which s represents an integer number of from 1 to 4); $R^4$ represents a $C_{1-6}$ alkyl group, a phenyl group, or a $C_{1-6}$ alkylphenyl; and m represents an integer number of from 1 to 100];

with a dianhydride represented by formula (II):

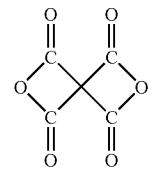

(II)

[wherein Y is a aliphatic tetravalent group containing 2 to 12 carbon atoms; a cycloaliphatic tetravalent group containing 4 to 8 carbon atoms; tetravalent monocyclic or polycyclic $C_{6-14}$ aryl; a group of the formula >Ph-X-Ph< wherein X represents a direct bond, $C_{1-4}$ alkylene which may be substituted with a halogen(s), —O-Ph-O—, —O—, —CO—, —S—, —SO—, or —$SO_2$—].

Examples of the diamine for preparing the polyimide in the present invention include, but not limited to, aromatic diamine such as p-phenylene-diamine (PDA), 4,4'-diaminodiphenyl oxide, 4,4'-diamino-diphenyl methane, 4,4'-diamino-diphenyl sulfone, 4,4'-diamino-diphenyl sulfide, 4,4'-di(m-aminophenoxy)diphenyl sulfone, 4,4'-di(p-aminophenoxy)diphenyl sulfone, o-phylene diamine, m-phylene diamine, p-phylene diamine, benzidine, 2,2'-diamino benzophenone, 4,4'-diamino benzophenone, 4,4'-diamino diphenyl-2,2'-propane, 1,5-diamino naphthalene, 1,8-diamino naphthalene, trimethylenediamine, tetramethylenediamine, hexamethylenediamine, 4,4-dimethyl hepta-methylenediamine, 2,11-dodecane diamine, bis (p-aminophenoxy) dimethylsilane, 1,4-bis(3-aminopropyldimethylsilyl)benzene, 1,4-diamino cyclohexane, o-xylenediamine, m-xylenediamine, acetoguanamine, benzoguanamine, 1,3-bis(3-aminophenoxy)benzene, bis[4-(3-amino-phenoxy)phenyl]methane, 1,1-bis[4-(3-aminophenoxy)phenyl]ethane, 1,2-bis[4-(3-aminophenoxy)phenyl] ethane, 1,2-bis[4-(3-aminophenoxy)-phenyl]butane, 2,2-bis [4-(3-aminophenoxy)phenyl]-1,1,1,3,3,3-hexafluoropropane, 4,4'-bis(3-aminophenoxy)biphenyl, bis[4-(3-amino-phenoxy)phenyl]ketone, bis[4-(3-aminophenoxy) phenyl]sulfide, bis[4-(3-aminophenoxy)phenyl]sulfoxide, bis[4-(3-aminophenoxy)phenyl]sulfone, bis[4-(3-aminophenoxy)phenyl]ether, etc. The foregoing diamines can be used alone or in combination of two or more.

Examples of the dianhydride for preparing the polyimide in the present invention include, but not limited to, aromatic dianhydride such as pyromellitic dianhydride (PMDA), 4,4'-oxy-diphthalic anhydride (ODPA), 3,3',4,4'-biphenyltetracarboxylic dianhydride (BPDA), 3,3',4,4'-benzophenonetetracarboxylic dianhydride (BTDA), ethylene-tetracarboxylic dianhydride, butanetetracarboxylic dianhydride, cyclopentanetetracarboxylic dianhydride, 2,2',3,3'-benzophenone-tetracarboxylic dianhydride, 2,2',3,3'-biphenyl-tetracarboxylic dianhydride, 2,2-bis(3,4-dicarboxyphenyl)propane dianhydride, 2,2-bis-(2,3-dicarboxyphenyl)propane dianhydride, bis(3,4-dicarboxy-phenyl)-ether dianhydride, bis(3,4-dicarboxyphenyl)sulfone dianhydride (DSDA), 1,1-bis(2,3-dicarboxyphenyl)ethane dianhydride, bis(2,3-dicarboxy-phenyl) methane dianhydride, bis(3,4-dicarboxyphenyl)-methane dianhydride, 4,4'-(p-phenylenedioxy)diphthalic dianhydride, 4,4'-(m-phenylenedioxy)diphthalic dianhydride, 2,3,6,7-naphthalenetetra-carboxylic dianhydride, 1,4,5,8-naphthalenetetracarboxylic dianhydride, 1,2,5,6-naphthalenetetracarboxylic dianhydride, 1,2,3,4-benzene-tetra-carboxylic dianhydride, 3,4,9,10-perylenetetracarboxylic dianhydride, 2,3,6,7-anthracenetetracarboxylic dianhydride, and 1,2,7,8-phenanthrene-tetracarboxylic dianhydride, etc. The foregoing dianhydrides can be used alone or in combination of two or more. Among these, pyro-mellitic dianhydride (PMDA), 4,4'-oxydiphthalic anhydride (ODPA), 3,3',4,4'-biphenyltetracarboxylic dianhydride (BPDA), 3,3',4,4'-benzophenonetetracarboxylic dianhydride (BTDA), and bis(3,4-dicarboxy-phenyl)sulfone dianhydride (DSDA) are preferable.

The dianhydrides can react with the diamines in aprotic polar solvents. The aprotic polar solvents are not particularly limited as long as they do not react with reactants and products. Embodiments of the aprotic polar solvents are, for example, N,N-dimethylacetamide (DMAc), N-methylpyrrolidone (NMP), N,N-dimethylformamide (DMF), tetrahydrofuran (THF), dioxane, chloroform (CHCl$_3$), dichloromethane, etc. Among these, N-methylpyrrolidone (NMP) and N,N-dimethyl-acetamide (DMAc) are preferable.

The reaction between the dianhydrides and the diamines can be generally conducted in the range of from room temperature to 90° C., preferably from 30 to 75° C. Additionally, the mole ratio of aromatic diamines to aromatic dianhydrides ranges between 0.5 and 2.0, preferably between 0.75 and 1.25. When two or more dianhydrides and diamines are individually used to prepare the polyamic acids, their kinds are not particularly limited but depend on the final use of the polyimides as required.

In the thermoset resin modified polyimide resin composition of the present invention, the cyanate (b) is represented by the following formula (III):

wherein n is a number of at least 2 and not more than 5, and $R^5$ may be:
(i) residues having a valence of at least 2 and derived from $C_{6-16}$ aromatic hydrocarbon, such as benzene, naphthalene, anthracene or pyrene;
(ii) organic groups consisting of a plurality of aromatic rings bonded directly or through a bridging atom or group, for example, those represented by the following formula (1):

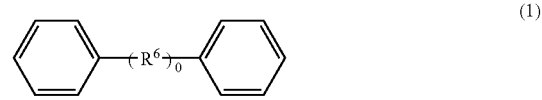

wherein o is zero (0) or one (1) and $R^6$ is a divalent aliphatic, aromatic or araliphatic hydrocarbon group, an oxygen atom, a sulfur atom, a carbonyl group, a sulfonyl group, a sulfinyl group, an alkyleneoxyalkylene group, an imino group,

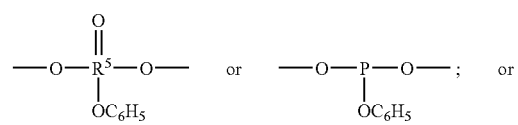

(iii) groups derived from novolac-type phenol resins.

These organic groups may be substituted with a $C_{1-4}$ alkyl group (such as methyl or ethyl), a $C_{1-4}$ alkoxy group (such as methoxy or ethoxy), a halogen atom (e.g., chlorine or bromine), or a nitro group.

Examples of organic group of formula (1) are those derived from biphenyl, diphenylmethane, α,α-dimethylphenylmethane, diphenyl ether, diphenyl dimethylene ether, diphenyl thioether, diphenyl ketone, diphenylamine, diphenyl sulfoxide, diphenyl sulfone, triphenyl phosphine, and triphenyl phosphate.

The cyanate (b) can be prepared by the method well known in the skilled field or commercial available from, for example, Ciba Specialty Chemicals under trade names of AroCy B-10, AroCy M-10, AroCy L-10, etc. Examples of the commercial available cyanates are, for example, as follows.

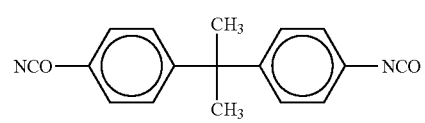

AroCy B-10

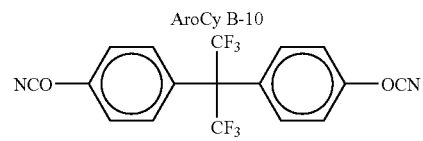

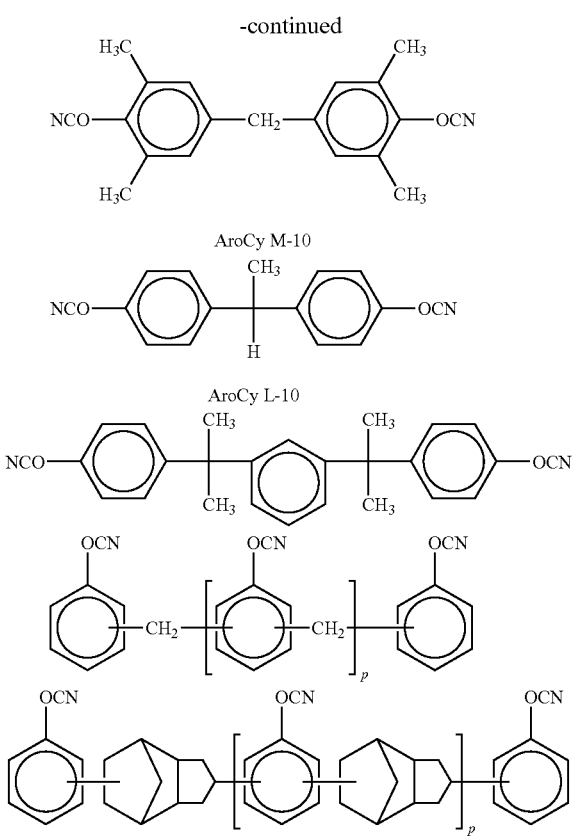

in which p is an interger of 0~20.

In the thermoset resin modified polyimide resin composition of the present invention, the bismaleimide (c) is represented by the following formula (IV):

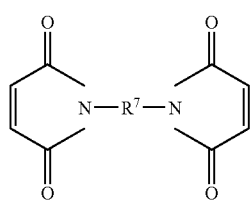

wherein $R^7$ is (i) divalent aromatic or aliphatic organic group containing 6 to 16 carbon atoms, such as phenylene, naphthylene, xylylene, cyclohexylene or hexahydroxylylene, and (ii) organic group represented by the following formula (1):

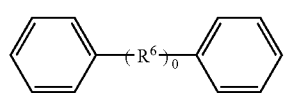

wherein o and $R^6$ are defined as above.

When $R^7$ in the above formula (IV) represents aromatic organic groups or aliphatic organic groups, those aromatic organic groups or aliphatic organic groups can be further substituted with substituents which are not participated with reaction, such as a $C_{1-4}$ alkyl group (such as methyl or ethyl) or a $C_{1-4}$ alkoxy group (such as methoxy or ethoxy).

The bismaleimide (c) used in the thermoset resin modified polyimide resin composition of the present invention can be prepared by the method well known in the skilled field, which comprises reacting melamic anhydride with diamines and then cyclodehydrating the resulting bismaleamide acids. In view of the reactivity, the diamines are preferably primary diamines, but secondary diamines can also be used. Examples of diamines are m-phenylene diamine, m-, or p-xylylenediamine, 1,4-cyclohexane diamine, hexahydroxylylene diamine, 4,4'-bisaminophenyl methane, 4,4'-bisaminophenyl sulfone, bis(4-amino-3-methylphenyl)methane (MDT), bis(4-amino-3,5-dimethylphenyl)methane (MDX), 4,4'-bisaminophenylcyclohexane, 4,4'-bisaminophenyl ether, 2,2-bis(4'-aminophenyl)propane, 2,2-bis(4-amino-3-methylphenyl)methane, and α,α-bis(4-aminophenyl)phenylmethane.

The bismaleimides can be used either alone or in admixture of two or more and their examples include, but are not limited to, N,N'-ethylene-bismaleimide, N,N'-butylene-bismaleimide, N,N'-phenylene-bis-maleimide, N,N'-hexamethylene-bismaleimide, N,N'-4,4'-diphenyl-methane-bismaleimide, N,N'-4,4'-diphenylether-bismaleimide, N,N'-4,4'-diphenyl-sulfone-bismaleimide, N,N'-4,4'-dicyclohexyl-methane-bis-maleimide, N,N'-xylylene-bismaleimide, N,N'-diphenyl-cyclohexane-bismaleimide, etc.

In the thermoset resin modified polyimide resin composition of the present invention, the nanometer filler (d) is silane-modified organic or inorganic powder having a particle size of from 10 nm~10 μm, or a mixture of the both. Examples of the nanometer filler include, but are limited to, alumoan, aluminum silicate, alkali aluminosilicate, borosilicate glass, titanium dioxide, zinc oxide, boron nitride, silicon nitride, nepheline, syenite, buddeluyite, eudialyte, $ZrO_2$, $Fe_2O_3$, NiO, $Cr_2O_3$, $3MgO.4SiO_2.H_2O$, $Al_2O_3.SiO_2.xH_2O$, FeOOH, talc, and $CaCO_3$, and MT-ST, MEK-ST, MIBK-ST commercial available from NISSAN CHEMICAL AMERICA CORPORATION, and HIGHLINK OG commercial available from CLARIANT SPECIALTY FINE CHEMICALS. The MEK-ST and MIBK-ST are 30% nanometer silica dispersion and the nanometer silica contained therein is surface-treated to allow it dispersing in non-alcoholic solvent well.

The polyimide resin composition modified with bismaleimide and cyanate of the present invention can be applied on a substrate by using a doctor knife or wire rod, then evaporate the solvent contained therein at a temperature of from 150 to 220° C., subsequently laminate it with a metal foil such as copper foil at a temperature of from 280 to 340° C. and a pressure of from 80 to 120 Kgf, and finally cure in an oven filled with nitrogen at a temperature of from 260 to 300° C. to obtain flexible printed board possessing high heat-resistance and high dimension stability.

The present invention will be further illustrated by reference to the following synthesis examples and working examples. However, these synthesis examples and working examples are not intended to limit the scope of the present invention but only describe the preferred embodiments of the present invention.

EXAMPLES

A. Synthesis Example 1

Synthesis of Polyamic Acid

Into a four-neck bottle reactor equipped with a stirrer and a nitrogen gas conduit under the flow rate of nitrogen gas of 20 cc/min, 41 g (0.1 mole) of 2,2-bis[4-(4-aminophenoxy)phenyl]-propane (BAPP) was placed and dissolved in N-methylpyrrolidone (NMP). After 15 minutes at a temperature of 15° C., in a first flask, 2.94 g (0.01 mole) 3,3',4,4'-biphenyltetracarboxylic dianhydride (BPDA) was dissolved in 10 g of NMP meanwhile maintained at a temperature of 15° C. and kept introducing of nitrogen. In a second flask, 22.54 g (0.07 mole) of 3,3',4,4'-benzophenone-tetracarboxylic dianhydride (BTDA) was dissolved in 15 g of NMP and fed into the above reactor that the nitrogen gas was continuously charged and stirred to carry out the reaction for one hour. 6.2 g (0.02 mole) of 4,4'-oxydiphthalic anhydride (ODPA) and 30 g of NMP were fed in a third flask and then stirred to dissolve. Subsequently, the mixture in the third flask was added to the above reactor that the nitrogen gas was continuously charged and stirred at a temperature of 15° C. to carry out the reaction for four hours to obtain polyamic acid (PAA) resin. Stopping the introduction of nitrogen, the reactor was equipped with Dean Stack instrument to distill water off. 87 Grams of toluene was added into the reactor and the temperature of the reactor was increased to 185° C. for subjecting to cyclodehydration to convert polyamic acid into polyimide resin while azeotropic distillation with toluene was carried out to remove water continuously. When no water was distilled off, the temperature of the reaction was cooled to room temperature. Then methanol was added into the reactor to precipitate the polyimide resin. The precipitated polyimide resin was filtered and washed with methanol twice, and dried in an oven to obtain polyimide resin powder.

0.5 Gram of the resultant polyimide was dissolved in 100 ml of NMP, and its intrinsic viscosity (IV) at a temperature of 25° C. was measured as 0.65 dl/g according to the following method. In hereinafter, the polyimide prepared in Synthesis Example 1 is called as PI-1.

Measurement of IV a. Preparation of Polyimide Solution
    a.1 Obtaining weight (W) of polyimide vanish with accuracy to 0.5 g, then placing into a 15-ml flask, adding N-methylpyrrolidone to 15 ml, shaking and dissolving.
    a.2 Pouring the resultant polyimide solution into capillary Viscosmeter (#100 Ubbehold Viscosmeter).
    a.3 Equilibrating whole system in a thermostatic trough at a temperature of 25□ for 15 minutes.
    a.4 Sucking the solution up by using a safety bulb.
    a.5 Releasing the bulb, measuring the time that the solution passes two marked points for three times, and taking the average value (t in sec.)
    a.6 Repeating the above procedures for a blank solution, and similarly taking its average value ($t_0$ in sec.)

b. Measurement of Solid Content
    b.1 Obtaining weight (W1) of a blank aluminum plate.
    b.2 Weighting 10 gram of polyimide vanish into the aluminum plate and weighting again (W2)
    b.3 Placing the aluminum plate containing the polyimide vanish into an oven at a temperature of 190° C. for 5 hours, then removing out and placing in a dryer and cooling for 10 mins.
    b.4 Weighting the aluminum plate containing the polyimide vanish again (W3)
    b.5 Calculating the solid content (SC) from the following formula:

$$[(W3-W1)/(W2-W1)] \times 100\%$$

c. Calculating Iv (Inherent Viscosity) Value from the Following Formula:

$$C=SC*W*100/15 \text{ wherein } C \text{ is in a unit of g/dL}$$

$$IV=Ln(t/t_0)/C$$

Synthesis Examples 2 to 5

Polyamic Acids 1-2, 1-3, 1-4, and 1-5 were synthesized by the procedures similar to Synthesis 1 from the diamines and dianhydride listed in the following Table 1 and measured the intrinsic viscosity (IV) and then converted into polyimides which are referred to PI-2~PI-5, respectively.

TABLE 1

|  | Sy. Ex. 1 PI-1 | Sy. Ex. 2 PI-2 | Sy. Ex. 3 PI-3 | Sy. Ex. 4 PI-4 | Sy. Ex. 5 PI-5 |
| --- | --- | --- | --- | --- | --- |
| BPDA | 0.01 | 0.01 | 0.01 | 0.01 | 0.01 |
| BTDA | 0.07 | 0.07 | 0.07 | 0.07 | 0.07 |
| ODPA | 0.02 | 0.02 | 0.02 | 0.02 |  |
| DSDA |  |  |  |  | 0.02 |
| BAPP | 0.1 |  |  |  |  |
| BAPB |  | 0.1 |  |  |  |
| BAPS |  |  | 0.1 |  |  |
| TPE-R |  |  |  | 0.1 |  |
| APB |  |  |  |  | 0.1 |
| IV (dl/g) | 0.65 | 0.73 | 0.67 | 0.72 | 0.83 |

Note:
BPDA: 3,3',4,4'-biphenyltetracarboxylic dianhydride;
BTDA: 3,3',4,4'-benzophenonetetracarboxylic dianhydride;
ODPA: 4,4'-oxydiphthalic anhydride;
DSDA: 3,3',4,4'-biphenylsulfonetetracarboxylic dianhydride;
BAPP: 2,2-bis[4-(4-aminophenoxy)phenyl]propane;
BAPB: 4,4'-bis(4-aminophenoxy)biphenyl;
BAPS: bis[4-(4-aminophenoxy)phenyl]sulfone;
TPE-R: 1,4-bis(3-aminophenoxy)benzene; and
APB: 1,3-bis(3-aminophenoxy)benzene.

B. Formulation of Polyimide Resin Vanish

15 Grams of each polyimide resin powder prepared in above Synthesis Examples were placed into a 150 ml beaker and added with 85 grams NMP and stirred to dissolve completely and obtain a polyimide resin vanish having a solid content of 15%.

C. Formulation of Nanometer Filler

2 Grams of Nano $SiO_2$ (average particle size of 200 nm) commercial available from Degussa Corporation were placed into 30 grams of NMP and dispersed thoroughly by using high speed homogenizer at a spin speed of 4000 rpm to obtain a solution containing 2.5% layered silica.

Example 1

Formulation of Polyimide Resin Composition Modified with Bismaleimide and Cyanate Polyimide resin composition modified with bismaleimide and cyanate of the present invention was formulated by mixing the ingredients and composition shown in Table 2 in which the % is a % by weight. In other words, at room temperature, 0.6 g AroCy B-10 (2,2-bis(4-isocyanatephenyl) propane) was first stirred with 5 g NMP for 10 mins, then poured into the 15% polyimide resin vanish prepared in the above procedure B and stirred for one hour. Then, 2.4 g N,N-4,4'-diphenylmethane-bismaleimide (BMI) was dissolved in 15 g NMP and then added into the above mixture, and then 32 g filler dispersion prepared in the above procedure C and stirred to obtain polyimide resin composition modified with bismaleimide and cyanate, of which solid content is 12.9% and viscosity is 2300 cp.

Examples 2 to 7 and Comparative Examples 1 to 5

Polyimide resin compositions were prepared by following the procedure in Example 1 except using the ingredients and composition shown in Table 2.

sides of the polyimide film and laminated with copper foils on the both sides to produce two metal side flexible printed board.

The resultant flexible printed board was measured its peeling strength according to the method of IPC-TM650 2.2.9 and expressed as kgf/cm. Its coefficient of thermal expansion (CTE) was determined by TMA (Thermal Mechanical Analysis)(Model Q400, manufactured by Du-Pont TA), in which

TABLE 2

|  | Ex. 1 | Ex. 2 | Ex. 3 | Ex. 4 | Ex. 5 | Ex. 6 | Ex. 7 | Com. Ex. 1 | Com. Ex. 2 | Com. Ex. 3 | Com. Ex. 4 | Com. Ex. 5 |
|---|---|---|---|---|---|---|---|---|---|---|---|---|
| PI-1 (%) | 75 | 78 | 80 |  |  |  |  | 100 | 85 | 91 | 79 | 88 |
| PI-2 (%) |  |  |  | 75 |  |  |  |  |  |  |  |  |
| PI-3 (%) |  |  |  |  | 75 |  |  |  |  |  |  |  |
| PI-4 (%) |  |  |  |  |  | 75 |  |  |  |  |  |  |
| PI-5 (%) |  |  |  |  |  |  | 75 |  |  |  |  |  |
| Bismaleimide (BMI) (%) | 12 | 9 | 12 | 12 | 12 | 12 | 12 | 0 | 12 | 0 | 12 | 0 |
| Cyanate (B-10) (%) | 3 | 3 | 3 | 3 | 3 | 3 | 3 | 0 | 3 | 0 | 0 | 3 |
| Filler (%) | 10 | 10 | 5 | 10 | 10 | 10 | 10 | 0 | 0 | 10 | 10 | 9 |
| Solvent (NMP) (%) | 135 | 135 | 135 | 135 | 135 | 135 | 135 | 100 | 100 | 96 | 96 | 96 |
| Solid content (%) | 12.9 | 12.9 | 12.9 | 12.9 | 12.9 | 12.9 | 12.9 | 15.0 | 15.0 | 15.0 | 15.0 | 15.0 |
| Viscosity @25° C. (cp) | 2300 | 2250 | 2450 | 2453 | 2674 | 2353 | 2310 | 2510 | 2210 | 2490 | 2380 | 2350 |

BMI: N,N-4,4'-diphenylmethane-bismaleimide
Cyanate B-10: 2,2-bis(4-isicyanatephenyl)propane
Filler: Nano $SiO_2$ (average particle size of 200 nm) commercial available from Degussa Corporation E. Production of Flexible Printed Board The polyimide resin composition was applied on Apical polyimide film (manufactured by Kanegafuchi Kagaku Kogyo) having a thickness of ½ mil by using a wire rod to form a film having a thickness of 3 μm. The resultant film was placed in an oven at 200° C. for 0.5 hour to remove solvent. The dried polyimide film was laminated with a copper foil by using a flat pressing machine or a roll calendar at a temperature of 320° C. and a pressure of 100 Kgf, and then cured in an oven under nitrogen atmosphere at a temperature of 280° C. for one hour to produce a flexible printed board having high heat resistance and excellent dimension stability. Alternatively, the polyimide resin composition was applied on both $\alpha 1$ represents a measured CTE at a temperature lower than glass transition temperature (Tg) of the composition, and $\alpha 2$ represents a measured CTE at a temperature higher than Tg of the composition, and expressed as ppm/° C. The resultant flexible printed board was also measured its heat resistance by placing the board in soldering pot at a temperature of 340° C. and 360° C., respectively, for 10 mins and determining whether wrinkle or melting on its surface was occurred. If no wrinkle or melting occurred, it passed the test. The resultant flexible printed board was further measured its dimension stability according to the method of IPC-TM650 2.2.4 and comparing the dimensions after heating relative to that before heating. These results are listed in Table 3.

TABLE 3

|  | Ex. 1 | Ex. 2 | Ex. 3 | Ex. 4 | Ex. 5 | Ex. 6 |
|---|---|---|---|---|---|---|
| Peeling Strength (kgf/cm) | 1.5 | 1.4 | 1.5 | 1.4 | 1.5 | 1.5 |
| Dimension Stability (%, MD) | 0.02 | 0.07 | 0.05 | 0.01 | 0.04 | 0.02 |
| Dimension Stability (%, TD) | 0.03 | 0.05 | 0.07 | 0.05 | 0.07 | 0.05 |
| CTE ($\alpha 1$) (ppm/° C.) | 42 | 45 | 44 | 41 | 43 | 42 |
| CTE ($\alpha 2$) (ppm/° C.) | 15320 | 16774 | 15320 | 15637 | 16573 | 14689 |
| Heat resistance (340° C., 10 mins) | pass | pass | pass | pass | pass | pass |
| Heat resistance (360° C., 10 mins) | pass | pass | pass | pass | pass | pass |

TABLE 3-continued

| | Ex. 7 | Com. Ex. 1 | Com. Ex. 2 | Com. Ex. 3 | Com. Ex. 4 | Com. Ex. 5 |
|---|---|---|---|---|---|---|
| Peeling Strength (kgf/cm) | 1.6 | 1.7 | 1.4 | 1.7 | 1.3 | 1.5 |
| Dimension Stability (%, MD) | 0.05 | 0.12 | 0.08 | 0.10 | 0.09 | 0.11 |
| Dimension Stability (%, TD) | 0.03 | 0.15 | 0.09 | 0.12 | 0.08 | 0.09 |
| CTE ($\alpha 1$) (ppm/° C.) | 44 | 55 | 48 | 46 | 52 | 50 |
| CTE ($\alpha 2$) (ppm/° C.) | 17432 | 35908 | 22537 | 38609 | 29793 | 29900 |
| Heat resistance (340° C., 10 mins) | pass | pass | pass | pass | pass | pass |
| Heat resistance (360° C., 10 mins) | pass | Not available | pass | Not available | pass | Not available |

From the above, it is clear that the flexible printed board produced from the present polyimide resin composition modified with bismaleimide and cyanate exhibits excellent dimension stability, CTE when comparing with that prepared from the polyimide resin composition without bismaleimide and cyanate, due to the crosslinking of bismaleimide by itself and cyanate by itself or by each other. Therefore, the present invention can solve the high heat expansion coefficient encountered in conventional polyimide resin and improve heat resistance and thus can be laminated at relative low temperature.

What is claimed is:

1. A polyimide resin composition modified with bismaleimide and cyanate, which comprises (a) polyimide resin, (b) cyanate, (c) bismaleimide, and (d) nanometer filler, wherein (a) polyimide resin is contained in an amount of from 75 to 80% by weight, (b) cyanate is contained in an amount of 0.1 to 10% by weight, (c) bismaleimide is contained in an amount of 0.1 to 10% by weight, and (d) nanometer filler is contained in an amount of 1 to 40% by weight, all based on the total weight of the composition;

wherein the polyimide resin (a) is obtained from reacting a diamine represented by the formula (I):

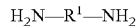

wherein $R^1$ represents (i) a direct bond; (ii) $C_{2-12}$ aliphatic divalent group; (iii) $C_{4-30}$ alicyclic divalent group; (iv) $C_{6-30}$ aromatic divalent group; (v) a group of the formula —Ph—O—$R^2$—O—Ph— (wherein $R^2$ represents a phenylene group (—Ph—) or a group of the formula —Ph—X—Ph— in which X represents a direct bond, a C1-4 alkylene group which may be substituted with halogen, a group of —O—Ph—O—, —O—, —CO—, —S—, —SO—, or —SO$_2$—); or (v) a group of the formula —$R^3$—(SiR$^4{}_2$—O)$_m$SiR$^4{}_2$—$R^3$— (wherein $R^3$ represents —(CH$_2$)$_s$—, —(CH$_2$)$_s$—Ph—, —(CH$_2$)$_s$—O—Ph— or —Ph—, in which s represents an integer number of from 1 to 4); $R^4$ represents a $C_{1-6}$ alkyl group, a phenyl group, or a $C_{1-6}$ alkylphenyl; and m represents an integer number of from 1 to 100;

with a dianhydride represented by formula (II):

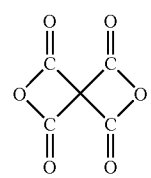

wherein Y is a aliphatic tetravalent group containing 2 to 12 carbon atoms; a cycloaliphatic tetravalent group containing 4 to 8 carbon atoms; tetravalent monocyclic or polycyclic $C_{6-14}$ aryl; a group of the formula >Ph—X—Ph< wherein X represents a direct bond, $C_{1-4}$ alkylene which may be substituted with a halogen(s), —O—Ph—O—, —O—, —CO—, —S—, —SO—, or —SO$_2$—;

the cyanate (b) is represented by the following formula (III):

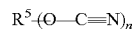

wherein n is a number of at least 2 and not more than 5, and $R^5$ may be:

(i) residues having a valence of at least 2 and derived from $C_{6-16}$ aromatic hydrocarbon;

(ii) organic groups represented by the following formula (1):

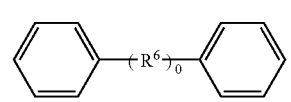

wherein o is zero (0) or one (1) and $R^6$ is a divalent aliphatic, aromatic or araliphatic hydrocarbon group, an oxygen atom, a sulfur atom, a carbonyl group, a sulfonyl group, a sulfinyl group, an alkyleneoxyalkylene group, an imino group;

(iii) groups derived from novolac-type phenol resins; and the bismaleimide (c) is represented by the following formula (IV):

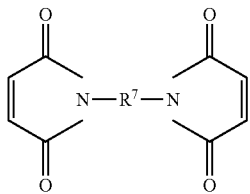
(IV)

wherein R⁷ is (i) divalent aromatic or aliphatic organic group containing 6 to 16 carbon atoms, and (ii) organic group represented by the following formula (1):

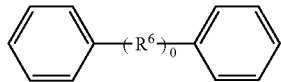
(1)

wherein o is zero (0) or one (1) and $R^6$ is a divalent aliphatic, aromatic or araliphatic hydrocarbon group, an oxygen atom, a sulfur atom, a carbonyl group, a sulfonyl group, a sulfinyl group, an alkyleneoxyalkylene group, an imino group, (iii) groups derived from novolac-type phenol resins.

2. The polyimide resin composition modified with bismaleimide and cyanate according to claim 1, wherein the organic group of formula (1) are those derived from biphenyl, diphenylmethane, α,α-dimethylphenylmethane, diphenyl ether, diphenyl dimethylene ether, diphenyl thioether, diphenyl ketone, diphenylamine, diphenyl sulfoxide, diphenyl sulfone, triphenyl phosphine, or triphenyl phosphate.

3. The polyimide resin composition modified with bismaleimide and cyanate according to claim 1, wherein the divalent aromatic or aliphatic organic group containing 6 to 16 carbon atoms is derived from phenylene, naphthylene, xylylene, cyclohexylene or hexahydroxylykene.

4. The polyimide resin composition modified with bismaleimide and cyanate according to claim 1, wherein the bismaleimide (c) is selected from the group consisting of N,N'-ethylene-bismaleimides, N,N'-butylene-bismaleimide, N,N'-phenylene-bismaleimide, N,N'-hexamethylene-bismaleimide, N,N'-4,4'-diphenylmethane-bismaleimide, N,N'-4,4'-diphenylether-bismaleimide, N,N'-4,4'-diphenyl-sulfone-bismaleimide, N,N'-4,4'-dicyclohexyl-methane-bismaleimide, N,N'-xylylene-bis-maleimide, and N,N'-diphenyl-cyclohexane-bismaleimide.

5. The polyimide resin composition modified with bismaleimide and cyanate according to claim 1, wherein the nanometer filler (d) is silane-modified organic or inorganic powder having a particle size of from 10 nm~10 μm, or a mixture of the both.

6. The polyimide resin composition modified with bismaleimide and cyanate according to claim 1, wherein the nanometer filler (d) is selected from the group consisting of alumoan, aluminum silicate, alkali aluminosilicate, borosilicate glass, titanium dioxide, zinc oxide, boron nitride, silicon nitride, nepheline, syenite, buddeluyite, eudialyte, $ZrO_2$, $Fe_2O_3$, NiO, $Cr_2O_3$, $3MgO.4SiO_2.H_2O$, $Al_2O_3.SiO_2.xH_2O$, FeOOH, talc, and $CaCO_3$.

* * * * *